United States Patent [19]

Smolen

[11] Patent Number: 4,915,995

[45] Date of Patent: Apr. 10, 1990

[54] INDEX MARKING ARTICLE FOR SUPERPOSED SHEETS

[76] Inventor: Benjamin Smolen, 10 Reed Ct., Great Neck, N.Y. 11024

[21] Appl. No.: 338,621

[22] Filed: Apr. 17, 1989

[51] Int. Cl.⁴ .............................. B32B 7/06; C09J 7/02
[52] U.S. Cl. ........................................ 428/40; 428/202;
    428/203; 428/352; 428/914
[58] Field of Search ................. 428/40, 202, 203, 352,
    428/914

[56] References Cited

U.S. PATENT DOCUMENTS 4,182,789  1/1980  Castelluzzo ........................ 428/138
4,623,569 11/1986  Relson ............................... 428/202

Primary Examiner—Alexander S. Thomas
Attorney, Agent, or Firm—Mark T. Basseches; Paula T. Basseches

[57] ABSTRACT

An article for applying index marks in precise superposed relation on a pair of juxtaposed receiver sheets includes a carrier having an adhesive backing, a first index mark on the surface of said carrier opposite said adhesive and a second index mark congruent with and covering the first index mark, the second index mark being defined by a dry transfer component.

2 Claims, 1 Drawing Sheet

INDEX MARKING ARTICLE FOR SUPERPOSED SHEETS

BACKGROUND OF THE INVENTION

1. Field of the Invention

The present invention is directed to a cost-effective device for affixing register marks to superposed sheets to enable the separation and precise reassembly of the sheets.

2. The Prior Art

In various fields of graphic arts artistic and like representations are effected on two or more superposed sheets disposed in fixed position relative to each other, portions of the overall representation being executed on one sheet and other portions on a different sheet.

By way of example, in the making of multi-color engravings, portions of the engraving to appear in one color are executed on a first sheet, with successive transparent sheets thereafter being superposed and while thus positioned having other portions of the design executed thereon. The various sheets are thereafter separated for the fabrication of engraving plates embodying different colors.

In order to assure precise assemblage of the images defined by the respective plates so as to avoid blurring, fringing or the like, it is conventional practice for the artist to position so-called index marks in the form of crosses or the like on the respective sheets to be replicated. The positioning of such marks on an individual basis represents a time-consuming operation since any inaccuracy is reflected in the finished artwork.

In accordance with the method of applying such marks, a dry transfer sheet carrying the mark is positioned and activated by burnishing to cause the mark to be removed from a carrier sheet to the artwork. Thereafter the process is repeated for a second and additional sheets, in each instance precise positioning of subsequent index marks being required. Since multiple index marks must be used with each sheet, the time consuming nature of this operation will be readily recognized.

U.S. Pat. Nos. 3909,329 and 4015,034, issued to the inventor hereof, represent efforts to provide a device which facilitates the locating or juxtaposition of sequential sheets in an expedited manner.

Briefly, U.S. Pat. No. 3909,329 disclosing a marking device wherein opposite faces of a carrier bear index marks in precise registry with each other, the device being used by interposing the same between superposed sheets and burnishing the sheets whereby dry transfer index marks are released to the facing surfaces of the sheets.

While the device is effective for its intended purpose, commercial manufacture of the product has proven difficult due to the difficulties inhering in printing in precise registry on opposed surfaces of a sheet.

U.S. Pat. No. 4015,034 discloses a marking device wherein a dry transfer film on a carrier is disposed between two juxtaposed sheets and, following burnishing, leaves an image on one such sheet and a silhouette thereof on the other sheet.

SUMMARY OF THE INVENTION

The present invention may be summarized as directed to an inexpensive, readily manufactured and used index marking device adapted to be activated to deposit index markings in precise registry on superposed sheets.

More specifically, the device of the invention is comprised of a carrier sheet having first and second surfaces, one said surface including an adhesive layer enabling the carrier to be bonded to one of two superposed sheets. The second surface of the carrier includes an index mark fixedly bonded thereto. The mark is covered by or comprises a release coat over which a second index mark in precise registry with the first mark is releasibly disposed. The second index mark is comprised of a release film whereby, upon disposition between two sheets and burnishing, the first index mark and carrier remain on one sheet and the second index mark is transferred to a second sheet.

It is accordingly an object of the invention to provide an improved device for applying index marks in precise registry on superposed sheets.

To attain these objects and such further objects as may appear herein or be hereinafter pointed out, reference is made to the accompanying drawings forming a part hereof, in which.

DETAILED DESCRIPTION OF THE DRAWINGS

Figure 1:
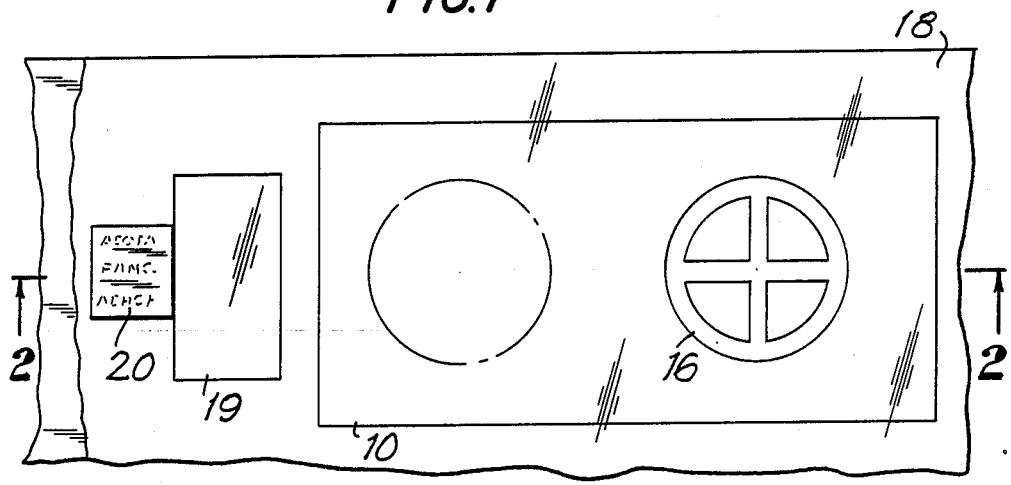
FIG. 1 is a top plan view of a device an accordance with the invention.

As will be apparent, the drawings are schematic, the thickness components in particular being exaggerated to facilitate an understanding of the invention.

The device, which may be in the form of a multiplicity of similar devices forming a strip, is comprised of a carrier sheet 10, the undersurface 11 of which includes an adhesive layer 12 which may be of pressure sensitive nature and may be supplied with a covering release sheet (not shown) to be removed prior to use.

The upper surface 13 of the carrier 10 includes an index mark 14 illustratively in the form of a cross with a circle. Index mark 14 may be comprised of a conventional ink composition.

The mark 14 is covered by a release agent 15, such as Quillon, a material known per se and having ready release qualities as respects the dry transfer index mark 16 next to be described.

It is contemplated that the Quillon release component may comprise a cover or coating layer as shown at 15, or may be embodied in the ink formulation of the index mark 14.

The dry transfer index mark 16 is deposited in precisely superposed relation to the mark 14 by printing steps known per se. The location of the index mark 16 relative to the mark 14 is facilitated by the fact that the two said marks are disposed on the same surface of the carrier 10.

The mark 16 may be comprised of any of a number of known transfer materials and need not further be described, reference being made to U.S. Pat. Nos. 3213,913, 3275,465, 3294,612, as well as others referred to in the above referenced patents.

The device is used by inserting the same between a pair of superposed sheets, illustratively lower sheet 17 and transparent upper sheet 18.

The lower sheet may include graphic materials 19 which must ultimately be realigned with other graphic materials 20 appearing on transparent upper sheet 18.

Figure 2:
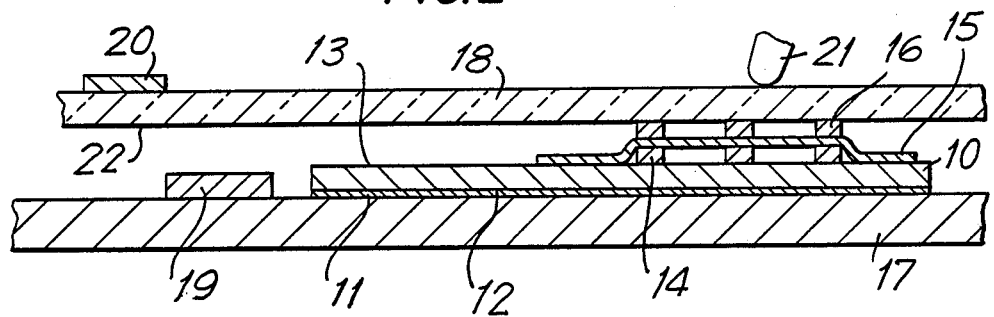
FIG. 2 is a magnified section taken on the line 2—2 of FIG. 1 with the device interposed between a pair of superposed sheets carrying artwork.
Figure 3:
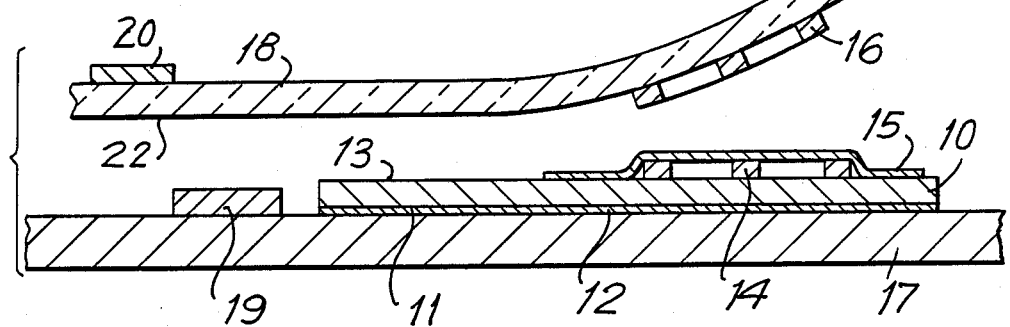
FIG. 3 is a view similar to FIG. 2 showing the position of the components of the device after partial separation of the graphics bearing sheets.

As shown in FIG. 2, the carrier 10 is bonded via adhesive layer 12 to lower sheet 17 and the upper surface of the upper sheet 18 is thereafter burnished as by a dully hard object 21. The burnishing action causes the index mark 16 to be released from the carrier sheet 10 and bonded to the undersurface 22 of the upper sheet 18, whereby the sheets are separated, as shown in FIG. 3, the index mark 16 is carried away with the upper sheet 18.

With a plurality of pairs of registering index marks fixedly secured to the respective sheets 17, 18, it is a simple matter to reassemble the sheets in precise registry by merely realigning the index marks carried by the sheets.

Where three or more sheets must be realigned, the described process is repeated between each pair of sheets to be reoriented.

As will be apparent to those skilled in the art and familarized with the instant disclosure, numerous details of construction may be varied without departing from the spirit of the invention, which is accordingly to be broadly construed within the scope of the appended claims.

Having thus described the invention and illustrated its use, what is claimed as new and is desired to be secured by Letters Patent is:

1. An article for applying index marks in precise superposed relation on a juxtaposed pair of receiver sheets comprising a carrier sheet having a first and a second surface, adhesive means on said first surface for fixedly mounting said carrier sheet to a receiver sheet, said second surface of said carrier sheet including a first index mark fixedly bonded thereto, a release coat superposed over said first index mark, a second index mark releasibly supported on said release coat in precise registry with said first index mark, said second index mark comprising an opaque dry transfer mass including pressure activated adhesive components integrated therein and exposed at the surface of said second index mark remote from said release coat.

2. An article in accordance with claim 1 wherein said release coat is integrated into said first index mark.

* * * * *